June 4, 1957
C. S. FULLER
2,794,846

FABRICATION OF SEMICONDUCTOR DEVICES

Filed June 28, 1955

INVENTOR
C. S. FULLER
BY Edwin B. Cave
ATTORNEY

United States Patent Office 2,794,846
Patented June 4, 1957

2,794,846

FABRICATION OF SEMICONDUCTOR DEVICES

Calvin S. Fuller, Chatham, N. J., assignor to Bell Telephone Laboratories, Incorporated, New York, N. Y., a corporation of New York Application June 28, 1955, Serial No. 518,556
19 Claims. (Cl. 136—89)

This invention relates to the fabrication of semiconductor devices, and particularly to the formation of junctions between semiconductive materials of differing conductivity types in such devices.

Semiconductors, such as silicon or germanium, may be classified into three general categories with respect to conductivity properties. Conduction in n-type material, containing electron-donating impurities, is largely by the donated electrons. In p-type material, which has significant electron-acceptor impurities, the movement of resultant positive charges, or holes, mainly accounts for conductivity. Intrinsic semiconductor material, ideally containing no significant impurity, and compensated semiconductor material, in which the concentration of impurities which are donors and the concentration of impurities which are acceptors are exactly balanced, conduct by both electron and hole migration. In intrinsic or compensated semiconductor material, where there is no conductivity contribution from an impurity, conductivity is attributable solely to hole-electron pairs produced by thermal rupture of the bonds between semiconductor atoms in the crystal. The high specific resistivities of intrinsic or compensated semiconductor materials, compared with the resistivities of n- or p-type materials, indicate the relatively small part played in conductivity by thermally produced charge pairs. The thermally dependent process of bond rupture, which leads to only a limited conductivity, is overshadowed when impurities are present in the semiconductor to furnish a predominance of holes or electrons for conduction.

Junctions within the body of the semiconductor between semiconductor materials of differing conductivity types, especially junctions between p-type material and n-type material, have properties useful in devices used for rectification or amplification, for example, or in devices which are to be photosensitive. The theoretical principles of conduction in semiconductors, the characteristics of junctions between different semiconductor conductivity types, and the principles underlying the operation of the devices mentioned and other similar devices are considered in the book "Electrons and Holes in Semiconductors" by William Shockley, published by D. Van Nostrand Company, Incorporated, New York, in 1950.

One feature of the present invention is the formation of junctions between different semiconductor conductivity types near the surface of semiconductor bodies by diffusion of donor or acceptor impurities from a glassy coating on the semiconductor surface. The glassy coating may serve not only as an impurity source, but, variously, as a transparent, protective, or insulating coating for the semiconductor.

Another feature of the present invention is the formation of junctions by diffusion from a glassy material containing significant impurities, as described above, but for which process the impurity-donating glass also contains a conducting material dispersed throughout it. This conducting glass fired to the the semiconductor surface gives an ohmic contact to the semiconductor body.

Figure 1:
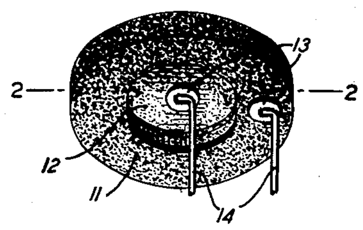
Fig. 1 is a perspective view of a photocell manufactured by the techniques of the present invention.

In Fig. 1, one face of a photocell is shown, said photocell consisting of a wafer 12 of semiconductive material, coated on the edges and on the periphery of the face shown with a conductive metal-bearing glaze 11 containing compounds which are significant impurities for the semiconductor. Portions 13 of the conducting glaze 11 and uncoated material 12 have been copper-plated and tinned, and leads 14 affixed for the conduction of current to and from the photocell.

Figure 2:
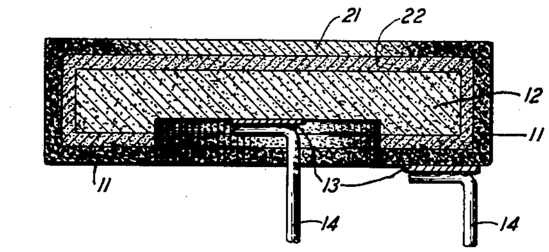
Fig. 2 is an elevation of the photocell of Fig. 1 taken in section along the line 2—2 of Fig. 1.

In Fig. 2, a section along the line 2—2 of Fig. 1, is shown the semiconductive body 12 of Fig. 1, which for the purposes of explanation herein may be considered to be of n-type silicon. That face of the body 12 which is principally to be exposed to light has been covered with a clear ceramic glaze 21 comprising a compound of a significant impurity such as boron oxide. On the edges, and on the periphery of the less light-sensitive face, has been fired the composition 11 of Fig. 1, comprising the ceramic of the coating 21 mixed with a portion of finely divided metal flake, conveniently platinum. In the firing process, the coatings 21 and 11 have been fused to form a ceramic integument over all but a circular portion of the silicon 12 on the less sensitive face of the photocell. Within the body of the silicon wafer 12, a thin subsurface layer 22 of p-type silicon, exaggerated in thickness for clarity in the drawing, has been formed by diffusion of significant impurity from the coatings 11 and 21 during the firing process. With wax protection on the other parts of the photocell, the portion of the photocell uncovered by the ceramics 21 and 11 has been etched, after formation of the p-type layer 22, with a mixture of nitric and hydrofluoric acids. By etching into the body of original material 12 to a depth beyond the penetration of the p-type layer 22, a sharp circular boundary between the p-type layer 22 and the n-type material 12 has been exposed. With wax protection on the exposed p-n junction, the circular central area of the silicon wafer 12 may be lightly sandblasted to roughen its surface. A portion 13 of the etched and sandblasted area is then conveniently copper plated and tinned, along with a similar portion 13 of the conducting composition 11. Leads 14 are then affixed to the tinned areas 13. One of the leads 14 makes contact with n-type semiconductor in the etched and sandblasted area; the other lead makes electrical contact with the p-type semiconductive layer 22 through conducting glaze 11.

The p-n junction formed at the boundary between layers 12 and 22 creates an electric field within the semi-conductor in the vicinity of the junction. This field is directed across the junction from n-type material 12 to p-type material 22. Light, incident on the transparent ceramic 21, is transmitted therethrough to the p-type layer 22 and the n-type layer 12, where photon bombardment of the semiconductor generates hole-electron pairs. Such charge pairs are separated by the electric field across the p-n junction. The holes produced in either layer tend to concentrate in the p-type layer 22 and the electrons tend to concentrate, because of the directing influence of the field across the junction, in the n-type layer 12. The resultant separation of charge creates an electric potential across the leads 14, and a current flow is detectable when the leads 14 are connected through an ammeter.

An alternative process in the manufacture of photocells similar to that modification shown in Fig. 1 and Fig. 2 eliminates the etching described earlier in this example. Sandblasting alone may be used to remove unwanted portions of the conducting ceramic 11. The sandblasting can also be used to expose the p-n junction between layers 12 and 22 shown in Fig. 2, as was the hydrofluoric acid-nitric acid etch previously mentioned. Masking is used on those portions of the photocell which are to remain unaffected by the sandblasting. Cells sandblasted but not etched may have a lower output than comparable etched cells but are useful for purposes where such lower efficiency is adequate.

Figure 3:
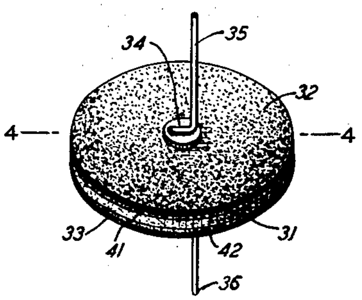
Fig. 3 is a perspective view of a rectifier produced according to the methods of the present invention.

In Fig. 3, the perspective view given of a completed rectifier shows a semiconductor wafer 31, of n-type silicon for example, each face of which has been coated with a conducting glaze. Glaze 32 on the upper face is, in this embodiment, an acceptor composition, such as borosilicate glaze, in which is dispersed a particulate metal, conveniently silver. The composition 33 on the lower face similarly contains a finely divided metal, such as silver, but in a matrix of a donor glaze, such as a phosphate glass. A copper-plated and tinned area 34 on the upper face, and a similar area, not shown, on the lower face, have been used to affix the leads 35 and 36 to the glazes on the upper and lower faces respectively.

Figure 4:
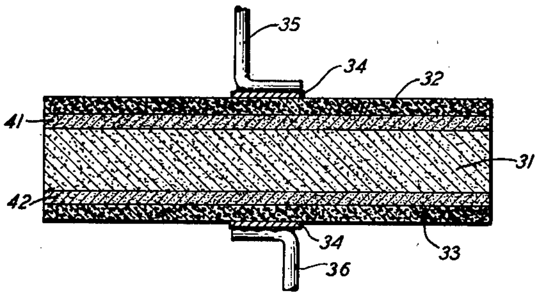
Fig. 4 is an elevation of the rectifier shown in Fig. 3 taken in section through the line 4—4 of Fig. 3.

In Fig. 4, a section taken at 4—4 of Fig. 3 is shown, indicating, as in Fig. 3, the coatings 32 and 33, and the leads 35 and 36 affixed to the plated and tinned areas 34. The n-type silicon wafer 31 has been modified by the appearance of two subsurface layers. One of these layers, 41, has been formed by the diffusion of boron into the silicon 31 from the borosilicate glass 32 on the upper surface. A second layer 42 has been formed by diffusion of phosphorous into the lower face of the original wafer 31 from the phosphate glass 33 fired on the lower face in this embodiment.

In the present case, the layers 41 and 42 do not both have the same effect on the electrical properties of the completed rectifier. Diffusion of the donor impurity phosphorous from the phosphate glaze 33 to form the layer 42 results only in the production of a material, still of n-type which contains more donor impurities than the original n-type body 31. Though the resistivities of the materials 42 and 31 may differ because of the disparity in their impurity concentrations, the mechanism of conduction remains the same in both layers. No active junction is formed at their interface.

However, layer 41, formed by diffusion of acceptor impurities into the original n-type silicon from the borosilicate glaze 32, is p-type silicon. The boundary between the layers 41 and 31 defines a p-n junction. As lead 35 is in electrical contact with the p-type layer 41 through the conducting glaze 32, and as lead 36 is in electrical contact with n-type silicon 42 and 31 through the conducting glaze 33, current passed from one lead to the other must cross the p-n junction. As such junctions transfer current preferentially in one direction, the device shown may be used as a rectifier.

In the production of the rectifier shown in Figs. 3 and 4, etching of the peripheral edge, after formation of the junction, may be done to assure that a clean boundary between the layers 41 and 31 of Fig. 4 is created.

Figure 5:
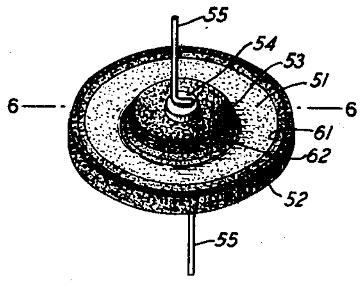
Fig. 5 is a perspective drawing of another type of rectifier which can be made according to the teachings herein.

Fig. 5 shows a perspective view of another variation in the manufacture of rectifiers. In the drawing 51 is a wafer of semiconductive material which may be specified as being of n-type silicon for this example. Around the periphery of the wafer, and on its lower face, the latter not shown, is a donor glaze composition 52, such as a phosphate glass, mixed with a finely divided flake of a metal such as platinum. A central section of the wafer has been covered with an acceptor glaze 53 such as a borosilicate glaze, mixed with a flake of a metal such as rhodium. The ceramic materials have been fired to form adherent coatings, and areas 54 on the top and bottom, the latter not shown, have been plated and tinned, and leads 55 affixed.

Figure 6:
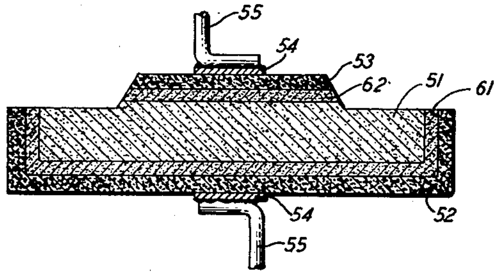
Fig. 6 is an elevation, in section, of the rectifier shown in Fig. 5, taken through the line 6—6 of Fig. 5.

In Fig. 6 the rectifier discussed above is shown in a section taken along the line 6—6 of Fig. 5. The n-type silicon body 51, platinum-containing phosphate glaze 52, borosilicate-rhodium composition 53, plated and tinned portions 54, and leads 55 are identifiable.

It can be seen that the original semiconductor body 51 has been altered in the regions beneath the applied glazes, the layer 61 having been formed beneath the phosphate glaze and the layer 62 having been formed where the borosilicate glaze is a covering. The layer 61 is, like the original wafer 51 in this example, an n-type silicon. Diffusion of phosphorous, a donor impurity, into the n-type silicon 51 from the glaze 52 has modified the resistivity of the original material, but no change in the mode of conduction, as distinct from the extent of conduction, has occurred.

The layer 62, on the other hand, is one of p-type silicon, formed by diffusion of, in this case, boron from the borosilicate coating 53. It is this layer 62, abutting a layer 57 of n-type silicon, which is responsible for rectification.

In the manufacture of the article shown in Figs. 5 and 6, the glaze 53 is used originally to cover the entire upper face of the silicon body 51. After the ceramics have been fired, an annular ring of the glaze 53 and p-type layer 62 is removed by etching so that the original n-type material 51 is exposed around the central unetched portion pictured. Such removal of the surrounding glaze and p-type silicon ensures that the p-n junction, shown as the boundary between the layers 51 and 62, will be sharply defined.

Figure 7:
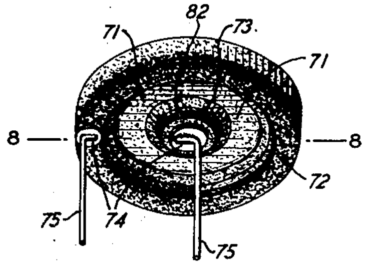
Fig. 7 is a perspective sketch of one modification of the photocells which may be made by practise of the invention herein described.

In Fig. 7 is shown a perspective view of a type of photocell which may be constructed using the techniques of the invention herein. The drawing, which is of one face of the photocell, shows a body of a semiconducting element 71, which in this instance may be taken to be of n-type silicon. On the edges of the photocell and on the face of the cell principally to be exposed to light, that face not being shown, an acceptor composition 72, such as a borosilicate glaze, has been fired. A finely divided flake of a metal such as rhodium has been added to those portions of the glaze composition 72 fired on the edges of the wafer and on the periphery of the pictured face. The composition 72 covering the more sensitive face of the cell, not shown, is a clear material. In the center of an annular trough etched into the silicon 71 an "island" of silicon, coated with a composition 73 comprising a donor glaze, such as a phosphate glass, mixed with finely divided metal, conveniently silver, remains. Both on the periphery and on the central "island," areas 74 have been plated and tinned, and leads 75 have been attached.

Figure 8:
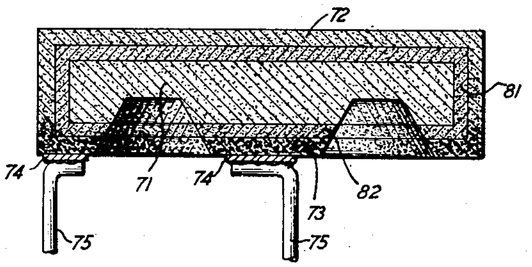
Fig. 8 is an elevation, in section, of the photocell modification shown in Fig. 7, taken through the line 8—8 of Fig. 7.

Fig. 8 shows a front view in section taken along the line 8—8 of Fig. 7. The sectional view shows the coatings 72 and 73 on the original semiconductive body 71, the plated and tinned areas 74, and the attached leads 75. Diffusion of acceptors from the borosilicate coating 72 has formed a layer 81 of p-type silicon over the principal light-sensitive face, and on the edges of the original n-type semiconductor 71. Diffusion of donor impurities, in this case phosphorous, has formed a layer 82 of n-type silicon in the central portion of the less sensitive face of the semiconductor 71. This n-type layer 82, though of lower resistivity than the original n-type silicon 71, has the same conductivity mechanism found in the original body. Light sensitivity and the other photocell properties of the device are associated with the p-n junction formed at the interface of layers 71 and 81.

The use of glazes with metal flake incorporated therein has facilitated the plating, tinning, and affixing of the leads 75. Good electrical contact to both n-type and p-type silicon is made through the glazes 73 and 72 respectively. In the original manufacture, the glaze 73 is used to cover only the central portion of the face generally not exposed to light, as shown. After firing, etching of the trough in the original silicon 71 is used to sharpen the exposed circular p-n boundary between the n-type silicon 71 and the p-type layer 81. The thickness of the layers 81 and 82 has been exaggerated for purposes of clarity in the diagrams.

Again, light incident on the transparent coating 72 is transmitted to the p-layer 81 and n-layer 71. Hole-electron pairs generated by the impinging photons are separated by the field of the p-n junction at the boundary of layers 71 and 81, and a current can be made to flow through leads 75 in contact respectively with n-type and p-type material.

The substances which have proved the best acceptor impurities for silicon and germanium are generally metals which, when bound within the tetrahedrally-linked semiconductor lattice, retain unfilled electron orbitals capable of accepting electrons from the lattice to create a positive charge or hole within the lattice. The elements of group III, aluminum, gallium, indium, thallium, and particularly boron, are specific examples of this class.

Conversely, donor substances are generally those which have electron-filled orbitals in excess of those required to bond in the tetrahedral lattice and which thus tend to lose the non-bonding negative charge as electrons free to serve as conduction electrons in the lattice. Phosphorous, arsenic and antimony are among this class, for example. At least one alkali metal, lithium, may also act as a donor impurity for silicon and germanium. Compounds of the elements specifically mentioned, or of other substances which are similarly members of the broader classes of materials suitable as acceptors or donors, can be used in the glazes as sources of significant impurities.

The valence state of the impurity found within the semiconductor body after diffusion is generally different from the valence state of the same impurity element initially to be found in the coating composition. Reaction with the semiconductor apparently is necessary for this conversion, and impurity compounds capable of reaction with the semiconductor are preferably chosen as glaze components. For example, boron, found as a positively charged trivalent species in $B_2O_3$ used in the coating compositions, is found as a negative singly-charged species in the semiconductor lattice after diffusion. So also, pentavalent phosphorous in the phosphorous pentoxide of a coating composition ultimately appears as a singly-charged positive species in the semiconductor. In these cases, as will usually be true, a reduction of the impurity by the semiconductor substance was required. Silicon, being more active chemically than germanium, may be used with glazes containing less reactive compounds of an impurity to be diffused. With germanium, longer periods of fusion or temperatures relatively closer to the melting point of the semiconductor may be needed because of the lower limit on possible maximum firing temperature imposed by the germanium melting point.

Such a reactive donor or acceptor compound is also preferably soluble in the glass melt over a broad range of melt compositions. In this way, the characteristics of the junction formed by diffusion can be altered by changing the concentration in the melt of the diffusing substance. As elevated temperatures may be used to fuse the components of the glazes, donor or acceptor compounds included in the glazes should be sufficiently nonvolatile to remain in the fused coating during the firing period. Generally, though compounds such as phosphorous pentoxide and arsenious oxide may have high volatility in the pure state, mixing such volatile oxides with other ingredients in compounding a glaze substantially reduces their volatility. No difficulty with escape of such substances from the fused glasses has been encountered in the temperature range below the silicon melting point.

If the broad requirements above are substantially fulfilled, almost any easily-handled compound of a donor or acceptor element will be adaptable to the present technique, though the oxides have proved especially convenient for use in forming glasses. Coating compositions, then, made with $B_2O_3$, $Al_2O_3$, $Ga_2O_3$, $In_2O_3$, or $Tl_2O_3$, can be successfully used to form p-type layers in n-type or intrinsic semiconductors, and coatings containing $P_2O_5$, $As_2O_3$, $Sb_2O_3$, or $Li_2O$, can convert intrinsic or p-type material to n-type.

The coating composition need not contain donor or acceptor compounds exclusively, since the simultaneous presence of diffused donors and acceptors in a semiconductor gives rise to a mutual cancellation of the effects of each on the conductivity. The final conductivity type is then either *n* or *p* as donor or acceptor impurities are in excess in the semiconductor. Thus, for example, donor oxides which are known in the art as suitable components for glaze compositions need not be omitted from a formulation even if the glaze is to be used as an acceptor-type coating on intrinsic material, if only an excess of total acceptor impurities over total donor impurities is finally to be found in the semiconductor after diffusion from the glaze.

Oxides of the element composing the semiconductor body being coated and the oxides of other metals which act as neither donor nor acceptor impurities may be used in the glazes. Such compounds as $SiO_2$, $GeO$, $GeO_2$, $SnO$, $PbO$, and $PbO_2$, for example, are oxides of semiconductors or metals having just sufficient filled electron orbitals to bond into a semiconductor lattice, with neither an excess nor a deficiency of electrons to affect the usual conductivity of the semiconductor. The use of $SiO_2$ in glass coatings laid on silicon bodies, for example, is particularly apt. Further, the oxides of some alkali metals, alkaline earth metals, and rare earth metals, such as $Na_2O$, $K_2O$, $CaO$, $MgO$, and $La_2O_3$, appear to have no observable effects in ameliorating semiconductor conductivity types when included in the glazing compositions. By using these materials as inert components in different formulations of the glaze compositions, a variety of glazes with differing physical properties can be synthesized.

For the formation of adherent glassy coatings on semiconductor surfaces, glass compositions whose thermal expansion characteristics are nearly similar to those of the semiconductor to be covered are preferably chosen. Though diffusion of impurities and formation of junctions may occur if a specific glaze is maintained on a semiconductor surface for the proper period of time in a molten state at a suitable temperature, chipping and cracking of the glaze may occur on cooling unless the thermal properties of the semiconductor and coating glaze are fairly compatible. Other factors in choosing a given glaze are obvious: for coatings on the sensitive face of a photocell, for example, a mixture giving a transparent glaze will be preferred; if exposure of a device to weathering is anticipated, the more impervious and corrosion resistant glasses are sought as covering materials. Specific examples of suitable glazing materials are given below.

Preparatory to coating, the surfaces of the semi-conductor may be treated physically or chemically to facilitate or improve the process of junction formation by diffusion. If deep junctions, approximately one mil or more below the semiconductor surface, are desired, slight surface defects of the semiconductor are not usually significantly detrimental. Wet grinding with a No. 600 silicon carbide grinding wheel or a similar grade of abrasive paper gives a satisfactory face for coating in these cases. For thin diffusion layers, of the order of 0.1 mil or less, the grinding is preferably followed by an etching step. A nitric acid-hydrofluoric acid etch known in the art is commonly used with silicon. The etching step further smooths the surface so that the thin diffusion layer to be formed thereon will tend to extend uniformly and unbroken into the body of the material. In carrying out the silicon etch, the semiconductor is usually immersed in concentrated nitric acid while concentrated hydrofluoric acid is added dropwise till the etchant shows the proper reactivity. In general, dropwise addition of hydrofluoric acid is continued till one part by volume of the acid has been added to two parts by volume of nitric acid. This mixture shows good etching action in most cases. After etching, any etchant on the surface is removed by thorough rinsing in water, and the silicon surface is then dried.

Application of the glass to the semiconductor surface before firing may be done in several ways. Sprinkling or dusting the ground glaze constituents directly on the surface is effective, particularly if only a flat upper surface of a plate or disc is to be coated. For most purposes, it is convenient to cover the semiconductor bodies with unfired glazing materials by applying a suspension of the unfired glaze, with a binder and a volatile solvent, to the surface to be glazed. A preliminary low temperature ignition fixes the ground vitreous material by evaporation of the suspending liquid. Heating for brief periods at more elevated temperatures, about 500° C., will remove a heat-depolymerizable or combustible binder, and high temperature firing causes fusion of the ground ingredients to form a glassy coating on the semiconductor surface. Solutions of heat-depolymerizable polymeric organic materials in a volatile solvent show particular effectiveness as suspending vehicles for the ground glass.

As binders, vinyl or substituted vinyl polymers, such as polymethylmethacrylate, polybutylmethacrylate, polyisobutylmethacrylate, and polyethylmethacrylate, are satisfactory heat-depolymerizable materials. For the solution of such binders, organic solvents which are suitable are "Cellosolve acetate" (ethylene glycol monoethyl ether acetate), "Carbitol acetate" (diethylene glycol monoethyl ether acetate), benzene, and some of the higher alcohols. Rohm and Hass "Acryloid A-10," a solution of 30 percent polymethylmethacrylate solids in "Cellosolve acetate" has proved a good suspending vehicle for the ground glazes.

Illustrative of the technique, boron-containing glasses have been applied to semiconductor surfaces by mixing 150 grams of the glass, ground to pass a No. 325 U. S. Standard Screen, with 25 grams of "Acryloid A-10." Additional solvent can be added to thin the suspension to achieve a desired consistency, and "Carbitol acetate" has been used for this purpose. If application is to be by spraying, a relatively thin liquid is best, for example. The particle size of the ground glass does not appear to be critical: particles having proper dimensions to facilitate adherence to the surface in the presence of the binder are preferred, or, if spraying is employed, particles having proper fineness to pass easily through the nozzle orifice are best. In general, it is most convenient to grind the particles to pass a No. 325 U. S. Standard Screen, such a sieve having a screen opening of 0.044 millimeter.

To remove the binder before final firing, the donor coatings exemplified above were later dried at 100° C., then heated for 30 minutes at 500° C.

The final firing of the glaze is done at a temperature chosen to be sufficiently high as to melt most of the glaze ingredients. Depending on the coating compositions and the semiconductor to be covered, temperatures between 800° C. and 1300° C. are usually chosen, and a temperature of 1200° C. has been found convenient in many cases for applying coatings to silicon, which fuses at 1420° C. For germanium, with a melting point at 935° C., temperatures below this value must be used in firing, of course. Complete fusion of the constituent compounds in the glaze is not always necessary. Compositions including highly refractory $Al_2O_3$ as an ingredient may show diffusion of aluminum from a sintered mass. Reduction and diffusion apparently take place without a melting of the difficultly fusible oxide.

The time period for which firing is maintained is such that both reaction of donor or acceptor compounds with the semiconductor material and diffusion of the significant impurities into the semiconductor can take place. The depth at which the junctions between conductivity types appears in the semiconductor, or, identically, the thickness of the layer of surface material into which the impurities from the coating glass have diffused, is a function of the length of the firing step, as well as being dependent on the firing temperature. For junctions appearing about one mil beneath a silicon surface, the firing time, at a temperature of 1200° C., may range from 5 hours to 20 hours. In several cases, thin layers, from 0.1 mil to 0.5 mil in depth, were produced in silicon by 30-minute heating at 1000° C. Firing times intermediate to these maximal and minimal values may be favored, depending on the particular case. The factors affecting a choice of firing time and temperature are further discussed below.

At low temperatures, the rates of the reactions occurring between the semiconductor material and the donor or acceptor compounds in the glaze to produce the impurity species finally found in the semiconductor may be limiting as a factor affecting the firing time. Above a temperature of about 800° C., most of these reactions occur readily, and the rate of diffusion of the impurity into the semiconductor surface usually determines the firing time necessary. Elevation of temperature, generally, will speed diffusion, but an upper limit may be imposed on such temperature acceleration of the diffusion process by the semiconductor melting point. Thus, as mentioned, silicon liquefies at 1420° C. and germanium melts at 935° C.

At a given temperature and surface concentration of impurity in the semiconductor, the diffusion rate is determined by the diffusion coefficients of the diffusing elements. The coefficients vary for each diffusing element and are also dependent on the material into which diffusion occurs. Aluminum and gallium, for example, at a given temperature and heating time, have been observed to form deeper diffusion layers in silicon than to arsenic or antimony under similar conditions. However, in germanium, the diffusion coefficients of arsenic and antimony are greater than those of aluminum or gallium, and the former elements diffuse more readily, under similar conditions, than the latter.

During the final firing, an inert atmosphere, such as nitrogen, argon, or helium may be maintained over the samples, though the heating may as easily be done in air. As the chemicals of the coating compositions, in the preferred general case, are themselves fully oxidized initially, and excessive oxidation of the semiconductor surface tends to be inhibited by the oxide coating fused over the surface, oxygen need not be excluded from the firing atmosphere.

As mentioned previously herein a finely divided metallic flake may be incorporated into the glaze compositions to render them conducting. In these cases, an ohmic contact to the silicon surface is formed simultaneously with the creation of a junction by diffusion of impurities from the glaze composition.

The metals found most useful in forming conducting glazed contacts are the noble metals, of which silver, gold, rhodium, platinum and palladium are particularly workable examples. Silver especially, because of its lower cost, greater availability, and better conductivity properties when used in a glazing composition of the kind under discussion, is of great usefulness.

The metals should preferably be ground to extreme fineness, less than 300 mesh. As mentioned previously, grinding to pass a No. 325 U. S. Standard Sieve, with an opening of 0.044 millimeter, is often used. When mixed with the previously prepared and also finely ground glazes, the metal flake upon firing forms a strongly bonded metallic contact to the semiconductor surface. The finer the particle size of both the glaze and the metal flake, the greater the opportunity for a high conductivity coating firmly adherent to the semiconductor base and highly coherent in internal consistency.

The relative amounts of ground glaze and metallic flake to be used in a particular coating composition depend upon the nature of the glass being used to diffuse impurities into the semiconductor surface. Sufficient ceramic material must be present to promote easy and relatively fast diffusion of impurity into the semiconductor. The glassy component must also be present in sufficient amount to lend hardness and durability to the metallic coat, while still containing sufficient metal flake to give the requisite conductivity.

Dependent on the glaze composition, then, from between one to twenty-five parts by weight of finely divided metal may be mixed with one part by weight of the ground glass in forming the conducting coatings.

The whole, flake and glaze, may be applied by methods similar to those described above used for applying the glaze alone. Similarly, drying and firing steps are carried out using the same procedures mentioned above for the glaze alone, the temperature and firing time being largely determined by the requirements imposed by the glaze. The firing must be sufficient, in time and temperature, to obtain proper fusion of the ceramic components and proper diffusion of the impurities being used to dope the semiconductor substrate.

To achieve contact with the metallic conducting glaze, a small portion of the surface of the conducting glaze is often removed by etching. The etched surface is then electroplated with rhodium or copper, for example, and finally tinned before the lead wires are attached. The etch, which may be effectively accomplished by a 15-second contact with dilute hydrofluoric acid, acts only to expose some particles of the metal flake by removing any covering ceramic material. In many cases, plated contact to the metal-bearing glaze may be made without any preliminary etching.

After plating and tinning, electrical contact with the semiconductor is easily established by soldering contact wires to the tinned surface of the glaze.

In the specific examples of plain and of conducting glaze compositions given below, the compositions and the methods and conditions of their use are presented as being illustrative only and are not to be construed in any way as limiting the scope of the invention herein disclosed.

*Example 1*

A slice of n-type silicon 30 mils in thickness and having a resistivity of 10 to 15 ohm-centimeters was heated in a sealed quartz tube containing a bead of fused boron oxide. The bead was kept out of contact with the silicon, and weighed about 0.03 gram. An atmosphere of helium at a pressure of about 0.1 millimeter of mercury was sealed into the tube at room temperature. Vapor deposition of $B_2O_3$ on the silicon surface, and diffusion of boron into the surface was achieved by heating the tube at 1150° C. for 16 hours. A p-n junction 0.6 mil deep was observed in the silicon, the surface layer of p-type material formed having a resistivity less than 0.01 ohm-centimeter. After an etching of its edges, to form a sharp boundary between the two conductivity types, the junction showed excellent rectification characteristics.

In this case, the extremely thin glassy deposit of $B_2O_3$ coating the silicon exterior was removable by rinsing with hot water.

*Example 2*

A soda-lime soft glass composition with added boron oxide was prepared by adding one part of powdered fused boron oxide to one part of powdered glass of the following approximate composition:

| | Percent |
|---|---|
| Silicon dioxide ($SiO_2$) | 73 |
| Calcium oxide ($CaO$) | 4 |
| Magnesium oxide ($MgO$) | 3 |
| Sodium oxide ($Na_2O$) | 20 |
| | 100 |

A solution of polymerized ethyl acrylate in toluene was used as a suspending vehicle in the application of the glaze. A pasty suspension of the ground glazing mixture was painted on a slice of n-type silicon and then dried in an oven at 100° C. The slice was fired in air at 500° C. for 30 minutes to remove the binder, and then fired at 1200° C. for 15 hours in an atmosphere of nitrogen. A p-n junction was found over the entire silicon slice at a depth of about one mil.

*Example 3*

"Pyrex" glass of the following approximate composition,

| | Percent |
|---|---|
| Silicon dioxide ($SiO_2$) | 80 |
| Sodium oxide ($Na_2O$) | 4 |
| Boron oxide ($B_2O_3$) | 13 |
| Aluminum oxide ($Al_2O_3$) | 2 |
| Other oxides | 1 |
| | 100 |

was powdered into a "Cellosolve acetate"-polymethylmethacrylate solution to give a thick paste. Following preliminary heating at 100° C. and 500° C. as in Example 2, a painted slice of 5 ohm-centimeters resistivity, n-type silicon was finally fired for 15 hours at 1200° C. in air to give a p-n junction of low surface resistivity one mil deep in the semiconductor.

*Example 4*

A slice of 0.5 ohm-centimeter n-type silicon was surfaced by grinding with water-wet No. 400 silicon carbide paper. A thin paste of ground fused boron oxide was made up with "Carbitol acetate" containing 5 percent by weight of the polymethyl methacrylate-"Cellosolve acetate" mixture previously mentioned as "Acryloid A–10." The paste was applied to the silicon surface, dried at 100° C., and fired for 30 minutes at 1050° C. in air. A p-type layer about 0.05 mil deep was found in the semiconductor surface under the oxide glaze.

*Example 5*

A slurry of ground gallium oxide, $Ga_2O_3$, was prepared in the above-mentioned mixture of "Carbitol acetate" containing 5 percent of "Acryloid A–10." A layer of the oxide approximately 2 mils thick was left on a wafer of n-type silicon of 0.7 ohm-centimeter resistivity after the wafer, painted with the slurry, had been dried at 100° C. A 30-minute firing in air at 1050° C. left a layer of p-type material about 0.10 mil thick in the semiconductor surface under the oxide coating, which was not visibly fused by firing at this temperature.

*Example 6*

A slice of p-type germanium with a resistivity of 0.6 ohm-centimeter was ground smooth with No. 400 "Aloxite" paper (aluminum oxide abrasive). The wafer was then etched to a smooth polished surface with an etchant containing the following ingredients:

| | Parts by volume |
|---|---|
| Glacial acetate acid | 15 |
| Concentrated nitric acid (70 percent) | 25 |
| Hydrofluoric acid (48 percent) | 15 |
| Bromine (liquid) | 0.2 |

After rinsing, a glaze suspended in 5 percent of "Acryloid A–10" mixed with "Cellosolve acetate" was painted on one face of the wafer. The glaze was of the composition:

| | Parts by weight |
|---|---|
| Silicon dioxide ($SiO_2$) | 33.5 |
| Lead dioxide ($PbO_2$) | 40.0 |
| Sodium oxide ($Na_2O$) | 6.5 |
| Antmony sesquioxide ($Sb_2O_3$) | 20.0 |
| | 100.0 |

The wafer was then fired in a helium atmosphere for one hour at 850° C. An n-layer 0.48 mil thick was found formed in the germanium at the germanium-glass interface.

*Example 7*

In the construction of a photocell, a thin slice of 0.4 ohm-centimeter n-type silicon was ground with moist No. 400 silicon carbide paper, and then etched to a polish with a mixture of one part by volume of concentrated hydrofluoric acid with two parts by volume of concentrated nitric acid.

After rinsing and drying, one face of the silicon slice was painted with a suspension of a borosilicate glass in "Carbitol acetate" containing 5 percent "Acryloid A–10." The glass had the following composition:

| | Percent by weight |
|---|---|
| Boron oxide ($B_2O_3$) | 30 |
| Aluminum oxide ($Al_2O_3$) | 10 |
| Barium oxide (BaO) | 10 |
| Silicon dioxide ($SiO_2$) | 50 |
| | 100 |

The face so treated is intended to be the face principally exposed to light. A similar suspension, but containing seven parts by weight of 325 mesh platinum powder to one part by weight of the ground glass listed above, was painted on the edges and in a ring covering the outer one-quarter inch of the opposite face. A circular center portion of this second face was left unglazed. The silicon slice was fired in air for 30 minutes at a temperature of 1050° C. After firing, the unglazed portion of the silicon was etched with the HF-$HNO_3$ etch mentioned, using wax protection for the glazed areas. Any thin film of doped silicon possibly formed on the unglazed portion of the matreial by diffusion from surrounding portions was thus removed to expose the original n-type material. After rinsing the etched area with water to remove traces of etchant, the area was roughened by light sandblasting. Electrical contact was made to this etched and roughened center portion of the silicon on the unglazed face, and also to the platinum flake glazed areas, by copper plating and tinning the areas and then soldering leads thereto. The doped face, on which a photosensitive p-n junction was formed by the glaze not containing metal flake, had an area of 4 square centimeters, and generated a short-circuit current of 7 milliamperes when held one-half inch from a 60-watt bulb.

A cell of this type has been shown in Figs. 1 and 2 herein.

*Example 8*

Approximately nine parts by weight of silver flake were mixed with one part by weight of the borosilicate glass specified in Example 7. The mixture was applied to one face of an n-type silicon wafer, one centimeter in diameter, and of 0.5 ohm-centimeter resistitvity, using "Carbitol acetate" and "Acryloid A–10." On the opposite face, a coating of nine parts by weight of silver flake to one part by weight of a ground glaze formed by the fusion of sodium dihydrogen phosphate, $NaH_2PO_4$, was similarly painted using an organic binder in a volatile solvent. The painted wafer was fired in air for two hours at 1200° C. The edges of the wafer were then etched, in the hydrofluoric-nitric acid mixture previously mentioned, to give a clean exposed boundary around the periphery of the wafer. After rinsing, wax, used for protection of the flat glazed surfaces during the peripheral etch, was removed. Electrode areas on each flat surface were copper plated and then tinned. The rectifier so produced was capable of carrying 100 milliamperes in the forward direction at voltages up to 40 volts, and was limited by the series resistance of silicon. The reverse current was approximately 100 microamperes.

A rectifier of this type is shown in Figs. 3 and 4.

The formation of glassy materials, suitable for use in glazing compositions, upon fusion of some phosphates, as, in this case, sodium dihydrogen phosphate, is discussed in the book "Inorganic Chemistry" by Therald Moeller, published by John Wiley and Sons, New York, in 1952, at pages 652 and 653.

*Example 9*

A rectifier similar to that in Example 8 was made from the n-type silicon of 0.5 ohm-centimeter resistivity used in the preceding example. One part by weight of the borosilicate glass specified in Example 7 was mixed with two parts by weight of powdered platinum, ground to 325 mesh. On the opposite silicon face, a conducting glaze containing 21.6 parts by weight of 325 mesh platinum powder to one part by weight of a phosphorous pentoxide base glass was applied. The glass had the following composition:

| | Percent by weight |
|---|---|
| Sodium oxide ($Na_2O$) | 25.4 |
| Silicon dioxide ($SiO_2$) | 14.7 |
| Aluminum oxide ($Al_2O_3$) | 25.0 |
| Phosphorous pentoxide | 34.9 |
| | 100 |

The wafer was fired for 15 minutes at a temperature of 1150° C., in air. The edges of the glazed wafer were etched with mixed HF–$HNO_3$, as before, and rinsed. The rectifier had the following characteristics:

| Reverse current (milliamperes) at— | |
|---|---|
| 2 volts | 0.01 |
| 10 volts | 0.100 |
| 20 volts | 1.000 |

The forward current, whose magnitude was limited by the series resistance of silicon, had a value of 0.100 milliampere at a voltage of 2 volts.

*Example 10*

A wafer of n-type silicon having a resistivity of 10 ohm-centimeters and a thickness of 40 mils was coated on one side with the silver-bearing phosphate glass composition of Example 8. A mixture of 5 parts by weight of finely divided rhodium flake to one part by weight of the borosilicate glass of Example 7 was applied to the opposite face, and the wafer fired in air for one and one-half hours at 1100° C. After firing, an annular ring of the glaze was removed by etching that face of the wafer on which the acceptor borosilicate glaze had formed a p layer, using wax protection for the other glazed areas on the wafer. By etching with HF and $HNO_3$ until the original n-type material was exposed, a clean exposed p-n junction in the unetched area was assured. Plating and affixing contacts permitted measurements showing that a reverse current of less than one milliampere could be obtained up to 50 volts. Again the series resistance of the wafer permitted only a low forward current.

A rectifier similarly constructed is pictured in Figs. 5 and 6.

*Example 11*

A photocell was made by painting the face principally to be exposed to light and the edges of an n-type silicon wafer of 0.6 ohm-centimeter resistivity with a suspension of the borosilicate glaze of Example 7. A peripheral ring 5/32-inch wide was painted on the opposite, less light sensitive, face, using a composition comprising one part by weight of the same glass as that used on the face mixed with ten parts by weight of finely divided silver, 325 mesh. An annular area 5/32-inch in width was left uncovered, and the remaining central portion of the principally unexposed face of circular wafer was coated with a mixture of ten parts by weight of silver with one part by weight of the phosphate glass specified in Example 9. The unit was then fired in air for 30 minutes at 1050° C. With wax protection on other surfaces, the annular uncoated area on the less sensitive face was then etched with mixed hydrofluoric and nitric acids so that n-type material was clearly exposed, giving a clean, circular, p-n junction at the outer edge of the etched area. The photocell so produced, after rinsing and the removal of wax, and after plating and affixing contacts, gave a 30-milliampere short-circuit current when held one inch from a 60-watt lamp. The exposed area was about 4 square centimeters.

A photocell of this type is shown in Figs. 7 and 8.

In this example and in Example 9, it is to be noted that n-type layers were formed by phosphorous diffusion into n-type silicon substrates despite the presence of substantial quantities of an acceptor impurity, aluminum, in the coating composition used in both examples. Aluminum oxide, added to the glaze to alter its expansion coefficient to match that of silicon, is relatively inactive at the temperature of 1050° C. at which the glaze was fired.

*Example 12*

A wafer of n-type silicon of resistivity 0.7 ohm-centimeters was lapped on moistened No. 600 silicon carbide paper, then etched in a two-to-one mixture by volume of concentrated nitric and hydrofluoric acids, rinsed and dried.

One face was painted with a suspension of the borosilicate glaze mentioned in Example 7. A second composition containing 10 percent by weight of the same glaze mixed with 90 percent by weight of finely divided rhodium flake was similarly applied as a suspension to the edges of the wafer and in a peripheral ring on the underside. Finally a central circular area was coated with a suspension of a ground glaze, prepared by the fusion of $NaH_2PO_4$ between 500° C. and 600° C. An annular uncoated area approximately 3/8-inch in width was left between the peripheral coat and the central coated portion.

The disc was fired for 45 minutes in air at a temperature of 1050° C. After firing, small areas of the peripheral metal-flaked coating and of the phosphate glazed portion were copper-plated and tinned, and electrical contact made thereto with leads.

Without a subsequent etch, as in Example 11, of the annular uncoated area on the "dark," or less often exposed, side of the wafer, the resultant photocell gave a total current of 80 milliamperes short-circuit current at a distance of one inch from a 60-watt bulb, equivalent to the perpendicular incidence of full summer sunlight. The open circuit voltage noted under similar circumstances of illumination was 0.25 volt. The area of the wafer was 4.5 square centimeters.

*Example 13*

A silicon power rectifier was prepared from a square wafer, one-fourth inch on a side, of n-type silicon with a resistivity of 20 ohm-centimeters. The wafer was lapped on moist silicon carbide paper to a thickness of 5 mils. One face of the lapped wafer was coated with a finely ground glass prepared by the fusion of sodium dihydrogen phosphate. For application, the glass was suspended in a thinned solution of "Acryloid A–10" containing 95 percent of added "Cellosolve acetate" as a thinner. The opposite face was painted in a similar manner with a suspension of the finely ground borosilicate glaze described in Example 7.

After drying and heating to 500° C. to depolymerize the temporary organic binder, final firing was done in air at 1250° C. for 2 hours. During the firing, the wafer was laid on a graphite block.

With wax protection on a circular central area 1/16-inch in diameter, the remainder of the wafer was etched away with hydrofluoric acid. After removal of the wax, a circular rectifier roughly resembling the rectifier shown in Figs. 3 and 4 was obtained.

A layer of p-type silicon was formed under the borosilicate glaze on one face of the wafer. This layer, as well as the n-layer formed under the phosphate glaze, was approximately 0.7 mil deep. Point contacts on opposite faces of the wafer permitted measurements of the rectification characteristics of the wafer.

At 5 volts, the reverse current passed by the rectifier was less than 0.05 milliampere. The forward current at 5 volts was 200 milliamperes, giving a rectification ratio of over 4000.

What is claimed is:

1. In the production of junctions between differing semiconductor conductivity types during the fabrication of semiconductor devices, the process of providing, simultaneously with junction formation, ohmic contact to the semiconductor, which process comprises applying a mixture of metal and glass-forming composition to the surface of a semiconductor, said composition comprising compounds of significant impurities for the semiconductor, and firing to form a conducting glaze from which significant impurities are diffused into the surface layers of said semiconductor wherever said mixture has been applied thereon.

2. The method of forming a p-n junction within a body of n-type silicon, which method comprises coating said body with a finely powdered glass-forming composition comprising at least one compound of boron, then firing said coated body at an elevated temperature to fuse the glass-forming composition, forming a glassy outer layer, and to diffuse boron into the surface layers of the silicon body wherever said glass-forming composition has been applied thereon.

3. The method as described in claim 2 in which said compound of boron is boron oxide, $B_2O_3$.

4. The method of forming a p-n junction within a body of n-type silicon, which method comprises coating said body with a finely powdered glass-forming composition comprising at least one compound of boron, said glass-forming composition having mixed therewith a finely divided metal, then firing said coated body at an elevated temperature to fuse the glass-forming composition, thereby forming a conducting glassy outer layer with said finely divided metal dispersed therethrough, and also thereby diffusing boron into the surface layers of the silicon body wherever said glass-forming composition has been applied thereon.

5. The method as described in claim 4 in which said finely divided metal is silver.

6. The method of forming a p-n junction within a body of p-type silicon, which method comprises coating said body with a finely powdered glass-forming composition comprising at least one compound of phosphorous, then firing said coated body at an elevated temperature to fuse said glass-forming composition, thereby forming a glassy outer coating and diffusing phosphorous into the surface layers of the silicon body wherever said glass-forming composition has been applied thereon.

7. The method as described in claim 6 in which said compound of phosphorous in phosphorous pentoxide.

8. The method of forming a p-n junction within a body of p-type silicon which method comprises coating said body with a finely powdered glass-forming composition comprising at least one compound of phosphorous, said glass-forming composition having mixed therewith a finely divided metal, then firing said coated body at an elevated temperature to fuse said glass-forming composition, thereby forming a conducting glassy outer layer with said finely divided metal dispersed therethrough and also thereby diffusing phosphorous into the surface layers of the silicon body wherever said glass-forming composition has been applied thereon.

9. The method as described in claim 8 in which said finely divided metal is silver.

10. A body of semiconductor material predominantly of a given conductivity type, coated with a fused glassy composition comprising at least one compound of a significant impurity capable of altering the conductivity type of the predominant semiconductor material, said semiconductor body having a thin subsurface layer of a conductivity type different from the type of the predominant material wherever said fused glassy composition has been applied thereon.

11. A body of silicon predominantly of n-type, coated with a fused glassy composition comprising at least one compound of a significant acceptor impurity, said silicon body having a thin subsurface layer of p-type silicon wherever said fused glassy composition has been applied thereon.

12. A body of p-type silicon, coated with a fused glassy composition comprising at least one compound of a significant donor impurity, said silicon body having a thin subsurface layer of n-type silicon wherever said fused glassy composition has been applied thereon.

13. A body of a semiconductor material predominantly of a given conductivity type, coated with a conducting fused glassy composition comprising at least one compound of a significant impurity capable of altering the conductivity type of the predominant semiconductor material and a finely divided metal dispersed throughout said fused glassy composition, said semiconductor body having a thin subsurface layer of a conductivity type different from the type of the predominant material wherever said fused glassy composition has been applied thereon.

14. A body of silicon predominantly of n-type, coated with a fused glassy composition comprising at least one compound of a significant acceptor impurity and a finely divided metal dispersed throughout said fused glassy composition, said silicon body having a thin subsurface layer of p-type silicon wherever said fused glassy composition has been applied thereon.

15. The silicon body as described in claim 14 for which said finely divided metal is silver.

16. A body of silicon predominantly of p-type, coated with a fused glassy composition comprising at least one compound of a significant donor impurity and a finely divided metal dispersed throughout said fused glassy composition, said silicon body having a thin subsurface layer of n-type silicon wherever said fused glassy composition has been applied thereon.

17. The silicon body as described in claim 16 for which said finely divided metal is silver.

18. A photocell comprising a body of n-type silicon covered in part with a clear fused glassy coating and in part with a conductive fused glassy coating containing finely divided metal, said coatings each comprising at least one compound of a significant acceptor impurity for silicon, said n-type silicon body further having a subsurface layer of p-type silicon formed by diffusion of significant acceptor impurities into said silicon body from said fused glassy coatings.

19. The method of altering the conductivity of a semiconductor material, which method comprises applying a glass-forming composition to the surface of said semiconductor material, which composition comprises at least one compound of a significant impurity for the semiconductor, fusing said glass-forming composition by firing said semiconductor material at an elevated temperature, and thereby diffusing significant impurities into the surface of said semiconductor wherever said glass-forming composition has been applied thereon.

References Cited in the file of this patent

UNITED STATES PATENTS

| | | |
|---|---|---|
| 2,530,217 | Bain | Nov. 14, 1950 |
| 2,629,800 | Pearson | Feb. 24, 1953 |
| 2,692,212 | Jenkins et al. | Oct. 19, 1954 |
| 2,697,269 | Fuller | Dec. 21, 1954 |
| 2,701,326 | Pfann et al. | Feb. 1, 1955 |
| 2,717,343 | Hall | Sept. 6, 1955 |
| 2,721,965 | Hall | Oct. 25, 1955 |